(12) United States Patent
Isaak

(10) Patent No.: US 6,472,735 B2
(45) Date of Patent: Oct. 29, 2002

(54) THREE-DIMENSIONAL MEMORY STACKING USING ANISOTROPIC EPOXY INTERCONNECTIONS

(76) Inventor: Harlan R. Isaak, 2870 Chios Rd., Costa Mesa, CA (US) 92626

( * ) Notice: Subject to any disclaimer, the term of this patent is extended or adjusted under 35 U.S.C. 154(b) by 6 days.

(21) Appl. No.: 09/826,621

(22) Filed: Apr. 5, 2001

(65) Prior Publication Data

US 2001/0054758 A1 Dec. 27, 2001

Related U.S. Application Data

(63) Continuation-in-part of application No. 09/598,343, filed on Jun. 21, 2000, now Pat. No. 6,404,043.

(51) Int. Cl.[7] .......................... H01L 23/02; H01L 29/40
(52) U.S. Cl. ........................ 257/686; 257/777; 257/685
(58) Field of Search ................................ 257/686, 685, 257/723, 777, 781, 784, 693, 673; 438/107, 109, 110

(56) References Cited

U.S. PATENT DOCUMENTS

| 3,723,977 | A | | 3/1973 | Schaufele ............. 340/173 PL |
|---|---|---|---|---|
| 4,851,695 | A | | 7/1989 | Stein ..................... 250/551 |
| 5,201,451 | A | | 4/1993 | Desai et al. ............ 228/5.5 |
| 5,269,453 | A | | 12/1993 | Melton et al. ........ 228/180.22 |
| 5,282,565 | A | | 2/1994 | Melton .................. 228/180.22 |
| 5,284,796 | A | | 2/1994 | Nakanishi et al. ....... 228/180.2 |
| 5,324,569 | A | | 6/1994 | Nagesh et al. .............. 428/198 |
| 5,328,087 | A | | 7/1994 | Nelson et al. .............. 228/175 |
| 5,607,539 | A | | 3/1997 | Cooke .......................... 156/291 |
| 5,700,715 | A | | 12/1997 | Pasch .......................... 257/666 |
| 5,759,046 | A | | 6/1998 | Ingraham et al. ............. 439/42 |
| 5,930,603 | A | | 7/1999 | Tsuji et al. .................. 438/127 |
| 5,986,342 | A | * | 11/1999 | Uchiyama et al. .......... 257/730 |
| 6,057,381 | A | | 5/2000 | Ma et al. ........................ 522/99 |
| 6,235,554 | B1 | * | 5/2002 | Akram et al. ................ 438/109 |

FOREIGN PATENT DOCUMENTS

JP           10-98076    *   4/1998   ........... H01L/21/60

* cited by examiner

Primary Examiner—Jasmine J B Clark
(74) Attorney, Agent, or Firm—Stetina Brunda Garred & Brucker

(57) ABSTRACT

A chip stack comprising at least two base layers, each of which includes a base substrate and a first conductive pattern disposed on the base substrate. The chip stack further comprises at least one interconnect frame having a second conductive pattern disposed thereon. The interconnect frame is disposed between the base layers, with the second conductive pattern being electrically connected to the first conductive pattern of each of the base layers via an anisotropic epoxy. Also included in the chip stack are at least two integrated circuit chips which are electrically connected to respective ones of the first conductive patterns. One of the integrated circuit chips is at least partially circumvented by the interconnect frame and at least partially covered by one of the base layers. The chip stack further comprises a transposer layer comprising a transposer substrate having a third conductive pattern disposed thereon. The first conductive pattern of one of the base layers is electrically connected to the third conductive pattern of the transposer layer via an anisotropic epoxy.

17 Claims, 3 Drawing Sheets

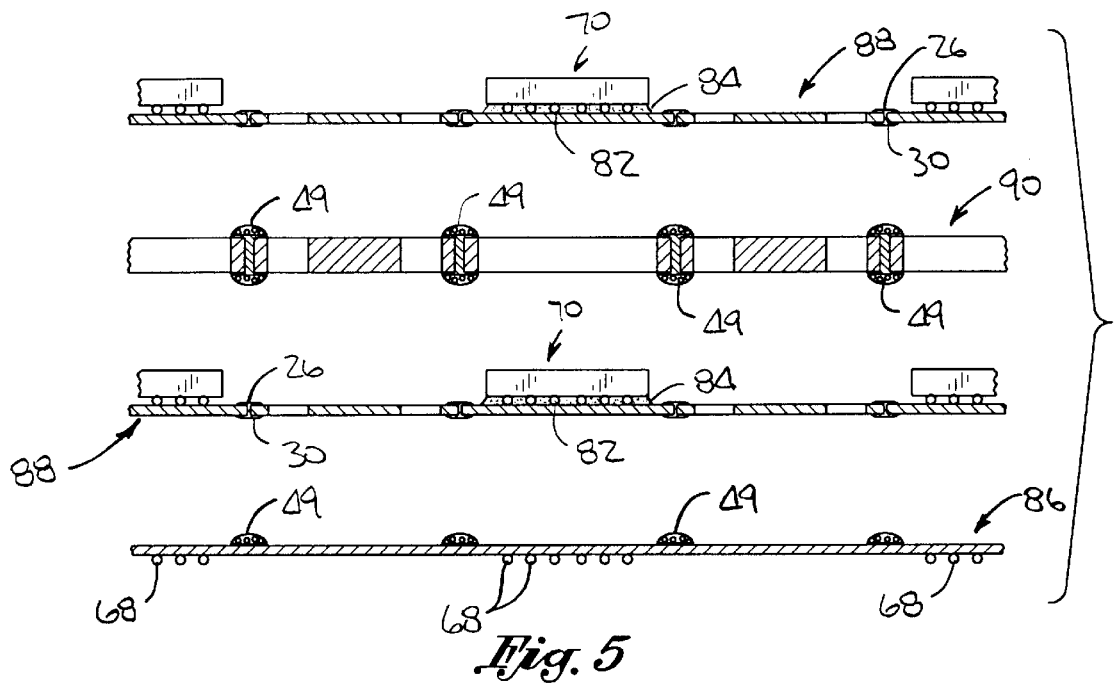
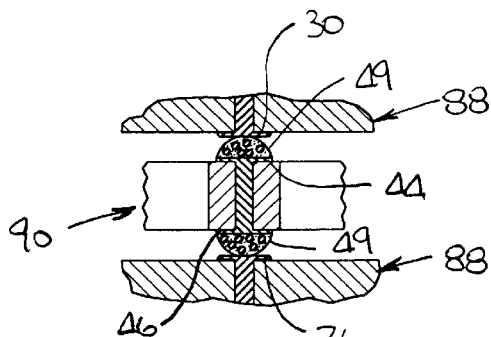 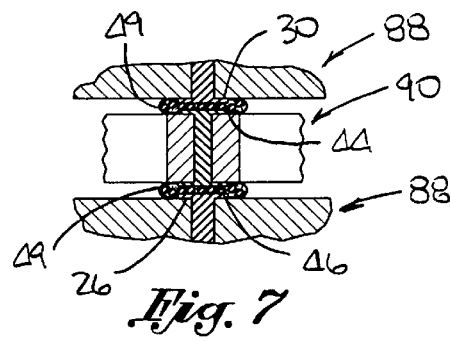
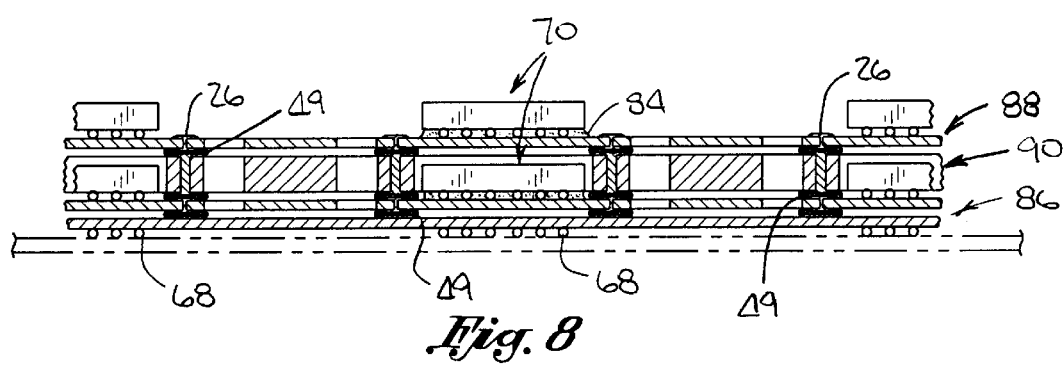

THREE-DIMENSIONAL MEMORY STACKING USING ANISOTROPIC EPOXY INTERCONNECTIONS

CROSS-REFERENCE TO RELATED APPLICATIONS

The present application is a continuation-in-part of U.S. application Ser. No. 09/598,343, now U.S. Pat. No. 6,404,043 entitled PANEL STACKING OF BGA DEVICES TO FORM THREE-DIMENSIONAL MODULES, filed Jun. 21, 2000.

STATEMENT RE: FEDERALLY SPONSORED RESEARCH/DEVELOPMENT (Not Applicable)

BACKGROUND OF THE INVENTION

The present invention relates generally to chip stacks, and more particularly to a chip stack which employs the use of an anisotropic epoxy as an alternative to solder to facilitate the interconnection of the various components of the chip stack.

Multiple techniques are currently employed in the prior art to increase memory capacity on a printed circuit board. Such techniques include the use of larger memory chips, if available, and increasing the size of the circuit board for purposes of allowing the same to accommodate more memory devices or chips. In another technique, vertical plug-in boards are used to increase the height of the circuit board to allow the same to accommodate additional memory devices or chips.

Perhaps one of the most commonly used techniques to increase memory capacity is the stacking of memory devices into a vertical chip stack, sometimes referred to as 3D packaging or Z-Stacking. In the Z-Stacking process, from two (2) to as many as eight (8) memory devices or other integrated circuit (IC) chips are interconnected in a single component (i.e., chip stack) which is mountable to the "footprint" typically used for a single package device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies or chips may also be used in the Z-Stacking process, such use tends to make the stacking process more complex and not well suited to automation.

In the Z-Stacking process, the IC chips or packaged chips must, in addition to being formed into a stack, be electrically interconnected to each other in a desired manner. There is known in the prior art various different arrangements and techniques for electrically interconnecting the IC chips or packaged chips within a stack. Examples of such arrangements and techniques are disclosed in Applicant's U.S. Pat. No. 4,956,694 entitled INTEGRATED CIRCUIT CHIP STACKING issued Sep. 11, 1990, U.S. Pat. No. 5,612,570 entitled CHIP STACK AND METHOD OF MAKING SAME issued Mar. 18, 1997, and U.S. Pat. No. 5,869,353 entitled MODULAR PANEL STACKING PROCESS issued Feb. 9, 1999.

The various arrangements and techniques described in these issued patents and other currently pending patent applications of Applicant have been found to provide chip stacks which are relatively easy and inexpensive to manufacture, and are well suited for use in a multitude of differing applications. The chip stack disclosed in the parent application provides yet a further alternative arrangement and technique for forming a volumetrically efficient chip stack. In such chip stack, connections are routed from the bottom of the chip stack to the perimeter thereof so that interconnections can be made vertically which allows multiple integrated circuit chips such as BGA, CSP, fine pitch BGA, or flip chip devices to be stacked in a manner providing the potential for significant increases in the production rate of the chip stack and resultant reductions in the cost thereof.

In the above-described chip stacks, solder is the interconnect medium used to form the various interconnections between the components of the chip stacks. The current trend in electronics is for more functionality in a small device. This generally means more I/O's in a smaller package. Interconnecting these smaller devices in turn requires a denser circuit board or other interconnection scheme. As the dimensions become smaller, the use of solder as the interconnect medium becomes increasingly less attractive. In this respect, smaller sizes require tighter control over such variables as solder paste and deposition, part geometries, reflow temperatures, etc. In these smaller devices, occurrences of solder bridging between neighboring interconnects becomes more common and difficult to control. Additionally, the smaller dimensions make post assembly cleaning very difficult. With regard to such cleaning, CFC's are no longer allowed, with water washable flux being difficult to remove in small cavities due to the high surface tension of water. Either no-clean flux must be used or the chip stack assembly must be designed with cleaning objectives in mind.

In the assembly of chip stacks, the interest in lead-free solders is increasing and eventually will be required in Asia, Europe, and the United States. The most promising substitutes for tin/lead solder are based on tin-silver-copper-bismuth combinations which have melting points in excess of 200° C. These melting points are substantially higher than traditional tin/lead solders, which melt at approximately 180° C. These elevated melting points will require higher soldering temperatures. For packaged chip and flip chip assemblies, the higher melting points of lead-free solders may prove to be a concern, since these devices may not be able to withstand repeated elevated reflow temperatures. Further, the higher temperatures negate the use of a high temperature solder for subassemblies combined with a low temperature solder for attachment to a mother board.

The use of solder as an interconnect medium creates further challenges in relation to the three-dimensional stacking of devices. The rework of a stacked assembly becomes difficult, tedious, and labor intensive. Accordingly, the first pass yield must be high. Solder bridging or solder opens cannot be tolerated in such chip stacks.

The present invention eliminates many of the problems and challenges arising as a result of the use of solder as the interconnect medium by providing a chip stack and method of stacking integrated circuit (IC) devices using an anisotropic epoxy for the interconnections between the layers as an alternative to solder. Anisotropic epoxy consists of a fast cure epoxy containing small conductive particles uniformly dispersed within the epoxy component of the material. The density of particles is limited to the amount that does not cause contact from particle to particle. The epoxy may be in the form of a liquid or film. Typically, gold plated nickel particles of uniform size anywhere from five to ten microns in diameter are used. The liquid is dispensed or film placed between opposing conductive pads, with heat and pressure thereafter being applied. With pressure, particles are trapped between the conductive pads, thus forming a conductive conduit between the pads. The heat then cures the epoxy which holds the structure (i.e., layers) together. If the pads are nickel/gold plated, the particles form a pressure contact between the pads. If the pads are plated with a tin based metal and sufficient heat is applied, the particles form a metallugical connection between the pads. By controlling the size of the particles, bridging between adjacent pads can be eliminated, thus allowing for the achievement of fine pitch between the pads. Since flux is not used, post assembly cleaning is not required. Also, the composition of the particles does not include any toxic metal such as lead.

The processing window associated with the use of an anisotropic epoxy as the interconnect medium in the chip stack is very tolerant, with process temperatures being below 200° C. Once cured, the anisotropic epoxy does not reflow at temperatures above 200° C. Chip stacks assembled through the use of the anisotropic epoxy can be easily made using a panel format, then separating the stacks using standard PCB routing procedures. For example, typical panels 4 inches by 5½ inches with multiple stack sites (16 or more on a panel)may be processed then stacked in a stacking fixture, and cured with heat and pressure as provided by a lamination press. The panels can easily be designed with multiple devices per layer for each resultant chip stack. Multiple devices such as BGA's, TSOP's, or bare die can be intermixed and placed on one base substrate. All interconnects between devices are made on the base substrate, with the I/O's for that layer being terminated in conductive pads around the perimeter of the base substrate as with a single device. The stacking then proceeds as a single device on a layer. These and other advantages of the present invention will be discussed in more detail below.

BRIEF SUMMARY OF THE INVENTION

In accordance with the present invention, there is provided a chip stack comprising at least two base layers (i.e., an upper base layer and a lower base layer). Each of the base layers includes a base substrate having a first conductive pattern disposed thereon. The chip stack further comprises at least one interconnect frame having a second conductive pattern disposed thereon. The interconnect frame is disposed between the upper and lower base layers, with the second conductive pattern being electrically connected to the first conductive pattern of each of the base layers via an anisotropic epoxy. In addition to the base layers and interconnect frame, the chip stack comprises at least two integrated circuit chips which are electrically connected to respective ones of the first conductive patterns via the anisotropic epoxy. The integrated circuit chip electrically connected to the first conductive pattern of the lower base layer is at least partially circumvented by the interconnect frame and at least partially covered by the upper base layer. The chip stack further preferably comprises a transposer layer which includes a transposer substrate having a third conductive pattern disposed thereon. The first conductive pattern of the lower base layer is electrically connected to the third conductive pattern of the transposer layer via the anisotropic epoxy.

In the present chip stack, the base substrate of each of the base layers defines opposed, generally planar top and bottom surfaces. The first conductive pattern itself comprises first and second sets of base pads which are disposed on the top surface of the base substrate, with the base pads of the second set being electrically connected to respective ones of the base pads of the first set via conductive traces. In addition to the first and second sets of base pads, the first conductive pattern includes a third set of base pads disposed on the bottom surface of the base substrate and electrically connected to respective ones of the base pads of the second set. More particularly, each of the base pads of the second set is preferably electrically connected to a respective one of the base pads of the third set via a base feed-through hole. The base feed-through hole may be plugged with a conductive material selected from the group consisting of nickel, gold, tin, silver epoxy, and combinations thereof. The integrated circuit chips are disposed upon respective ones of the top surfaces of the base substrates and electrically connected to at least some of the base pads of respective ones of the first sets via solder or the anisotropic epoxy. Additionally, the base pads of the second set of the lower base layer are electrically connected to the second conductive pattern of the interconnect frame via the anisotropic epoxy, as are the base pads of the third set of the upper base layer.

The interconnect frame of the chip stack itself defines opposed, generally planar top and bottom surfaces, with the second conductive pattern comprising first and second sets of frame pads disposed on respective ones of the top and bottom surfaces. Each of the frame pads of the first set is electrically connected to a respective one of the frame pads of the second set via a frame feed-through hole which also may be plugged with a conductive material preferably selected from the group consisting of nickel, gold, tin, silver epoxy, and combinations thereof. The interconnect frame is preferably disposed between the upper and lower base layers such that the frame pads of the second set are electrically connected to respective ones of the base pads of the second set of the lower base layer via the anisotropic epoxy, with the frame pads of the first set being electrically connected to respective ones of the base pads of the third set of the upper base layer via the anisotropic epoxy.

The transposer substrate of the present chip stack also defines opposed, generally planar top and bottom surfaces, with the third conductive pattern comprising first and second sets of transposer pads disposed on respective ones of the top and bottom surface of the transposer substrate. The transposer pads of the first set are electrically connected to respective ones of the transposer pads of the second set. Additionally, the base pads of the third set of the lower base layer are electrically connected to respective ones of the transposer pads of the first set via the anisotropic epoxy.

In the present chip stack, the transposer pads of the first set, the frame pads of the first and second sets, and the base pads of the second and third sets are preferably arranged identical patterns. Additionally, the transposer and base substrates each preferably have a generally rectangular configuration defining opposed pairs of longitudinal and lateral peripheral edge segments. The interconnect frame itself preferably has a generally rectangular configuration defining opposed pairs of longitudinal and lateral side sections. The transposer pads of the first set extend along the longitudinal and lateral peripheral edge segments of the transposer substrate. Similarly, the first and second sets of frame pads extend along the longitudinal and lateral side sections of the interconnect frame, with the second and third sets of base pads extending along the longitudinal and lateral peripheral edge segments of the base substrate. Each of the transposer pads of the second set preferably has a generally spherical configuration.

Each of the integrated circuit chips of the present chip stack preferably comprises a body having opposed, generally planar top and bottom surfaces, and a plurality of conductive contacts disposed on the bottom surface of the body. The conductive contacts of each of the integrated circuit chips are electrically connected to respective ones of the base pads of the first set of a respective one of the first conductive patterns. The electrical connection of the integrated circuit chips to respective ones of the first conductive patterns may be facilitated through the use of solder or through the use of the anisotropic epoxy. The transposer pads of the second set, the base pads of the first set, and the conductive contacts are themselves preferably arranged in identical patterns. When solder is used as the interconnect medium for the integrated circuit chips, the chip stack may further comprise a layer of flux/underfill (also referred to as a "no flow-fluxing underfill") disposed between the bottom surface of the body of each of the integrated circuit chips and respective ones of the top surfaces of the base substrates. Each layer of flux/underfill may be spread over the base pads of the first set of a respective one of the first conductive patterns. The body of each of the integrated circuit chips and the interconnect frame are preferably sized relative to each other such that the top surface of the body of the integrated circuit chip electrically connected to the lower base panel and at least partially circumvented by the interconnect frame does not protrude beyond the top surface thereof.

The integrated circuit chips are preferably selected from the group consisting of a CSP (Chip Scale Package)such as a BGA (ball grid array) device, a fine pitch BGA device, and a flip chip device. However, the integrated circuit chips may also comprise LP (leaded plastic) devices or packages such as TSOP (thin small outline package) and TQFP devices. The integrated circuit chips may comprise bare die devices as well. Further, the transposer and base substrates are each preferably fabricated from a polyamide or other suitable circuit board material which may be as thin as about 0.010 inches.

Those of ordinary skill in the art will recognize that a chip stack of the present invention may be assembled to include more than two base layers, more than one interconnect frame, and more than two integrated circuit chips. In this respect, a multiplicity of additional interconnect frames, base layers, and integrated circuit chips may be included in the chip stack, with the second conductive pattern of each of the interconnect frames being electrically connected to the first conductive patterns of any adjacent pair of base layers via the anisotropic epoxy, and each of the integrated circuit chips being electrically connected to the first conductive pattern of a respective one of the base layers. Additionally, the chip stack of the present invention may be assembled to include differing types of integrated circuit chips, i.e., an intermix of different types of packaged chips and bare die devices in any combination.

Further in accordance with the present invention, there is provided a method of assembling a chip stack. The method comprises the initial step of electrically connecting an integrated circuit chip to a first conductive pattern of a base layer. The integrated circuit chip may be electrically connected to the base layer either through the use of solder or the anisotropic epoxy. Thereafter, a second conductive pattern of an interconnect frame is electrically connected to the first conductive pattern via the anisotropic epoxy such that the interconnect frame at least partially circumvents the integrated circuit chip. Another integrated circuit chip is then electrically connected to the first conductive pattern of another base layer. The first conductive pattern of one of the base layers is then electrically connected to the second conductive pattern of the interconnect frame via the anisotropic epoxy such that one of the integrated circuit chips is disposed between the base layers. The method may further comprise the step of electrically connecting the first conductive pattern of one of the base layers to a third conductive pattern of a transposer layer via the anisotropic epoxy. In the present assembly method, a layer of flux/underfill may be applied to (i.e., spread over) each of the base layers over portions of the first conductive patterns prior to the electrical connection of respective ones of the integrated circuit chips thereto.

Still further in accordance with the present invention, there is provided a method of assembling a chip stack which comprises the initial steps of providing a transposer panel, at least two base panels, and at least one frame panel which each have opposed surfaces and a plurality of conductive pads disposed on the opposed surfaces thereof. A plurality of integrated circuit chips are also provided which each have opposed sides and include conductive contacts disposed on one of the sides thereof. In this assembly method, an anisotropic epoxy is dispensed on at least some of the conductive pads of each of the transposer, base, and frame panels. Integrated circuit chips are then placed upon each of the base panels such that the conductive contacts of each of the integrated circuit chips are disposed on at least some of the conductive pads of respective ones of the base panels. Thereafter, one of the base panels is stacked upon the transposer panel such that at least some of the conductive pads of the base panel are disposed on at least some of the conductive pads of the transposer panel. The frame panel is then stacked upon the base panel such that at least some of the conductive pads of the frame panel are disposed on at least some of the conductive pads of the base panel. Another base panel is then stacked upon the frame panel such that at least some of the conductive pads of the base panel are disposed on at least some of the conductive of the frame panel.

The assembly method further comprises the step of placing the chip stack into a heated lamination press to cure the anisotropic epoxy, thereby securing the base panels, frame panel(s), and transposer panel to each other. The curing process also facilitates the bonding of the conductive contacts of the integrated circuit chips to the conductive pads of respective ones of base panels in the event the anisotropic epoxy is employed as the interconnect medium therebetween. As indicated above, solder may alternatively be used as the interconnect medium between the integrated circuit chips and the base panels. If solder is used as the interconnect medium, the integrated circuit chips 70 will typically be pre-attached to the base panels through a solder reflow process. The assembly method may further comprise the steps of stacking spacer sheets between one of the base panels and the transposer panel, and between the frame panel and each of the base panels. The spacer sheets each have opposed surfaces and a plurality of openings disposed therein. When stacked between the base and transposer panels and between the frame and base panels, the openings of the spacer sheets are aligned with the conductive pads of such panels.

BRIEF DESCRIPTION OF THE DRAWINGS

These, as well as other features of the present invention, will become more apparent upon reference to the drawings wherein:

FIG. 5 is an exploded view of the various panels which are stacked upon each other in accordance with a preferred method of assembling the chip stack of the present invention;

FIG. 6 is a partial cross-sectional view of the panels shown in FIG. 5 as stacked upon each other prior to an epoxy curing step of the present assembly method;

FIG. 7 is an enlargement of the encircled region 7 shown in FIG. 8; and

FIG. 8 is partial cross-sectional view of the panels shown in FIG. 5 as stacked upon each other subsequent to the completion of the epoxy curing step of the present assembly method.

DETAILED DESCRIPTION OF THE INVENTION

Figure 1:
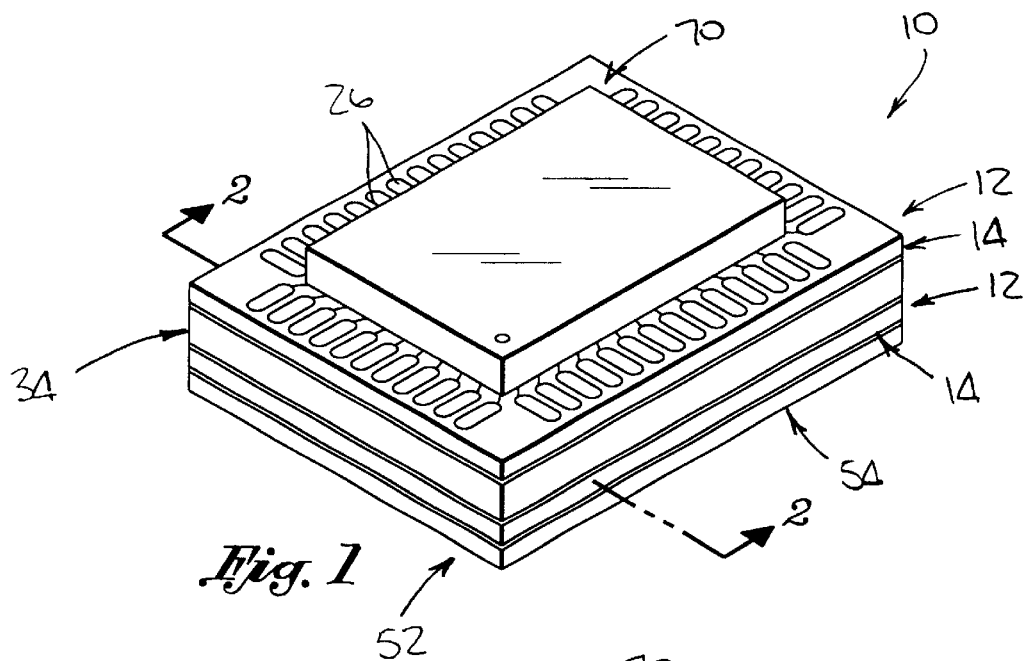
FIG. 1 is a top perspective view of a chip stack constructed in accordance with the present invention.

Referring now to the drawings wherein the showings are for purposes of illustrating a preferred embodiment of the present invention only, and not for purposes of limiting the same, FIG. 1 perspectively illustrates a chip stack 10 assembled in accordance with the present invention. The chip stack 10 comprises at least two identically configured base layers 12. Each of the base layers 12 itself comprises a rectangularly configured base substrate 14 which defines a generally planar top surface 16, a generally planar bottom surface 18, an opposed pair of longitudinal peripheral edge segments 20, and an opposed pair of lateral peripheral edge segments 22.

Disposed on the base substrate 14 of each base layer 12 is a first conductive pattern which itself preferably comprises a first set of base pads 24 and a second set of base pads 26 which are each disposed on the top surface 16 of the base substrate 14. The base pads 24 of the first set are preferably arranged in a generally rectangular pattern or array in the central portion of the base substrate 14, with the base pads 26 of the second set extending linearly along the longitudinal and lateral peripheral edge segments 20, 22 of the base substrate 14. The base pads 24 of the first set are electrically connected to respective ones of the base pads 26 of the second set via conductive traces 28. In addition to the base pads 24, 26 of the first and second sets, the first conductive pattern of each base layer 12 comprises a third set of base pads 30 which is disposed on the bottom surface 18 of the base substrate 14. The base pads 30 of the third set are preferably arranged in an identical pattern to the base pads 26 of the second set, and extend linearly along the longitudinal and lateral peripheral edge segments 20, 22 of the base substrate 14 such that each of the base pads 30 of the third set is aligned with and electrically connected to a respective one of the base pads 26 of the second set.

Figure 2:
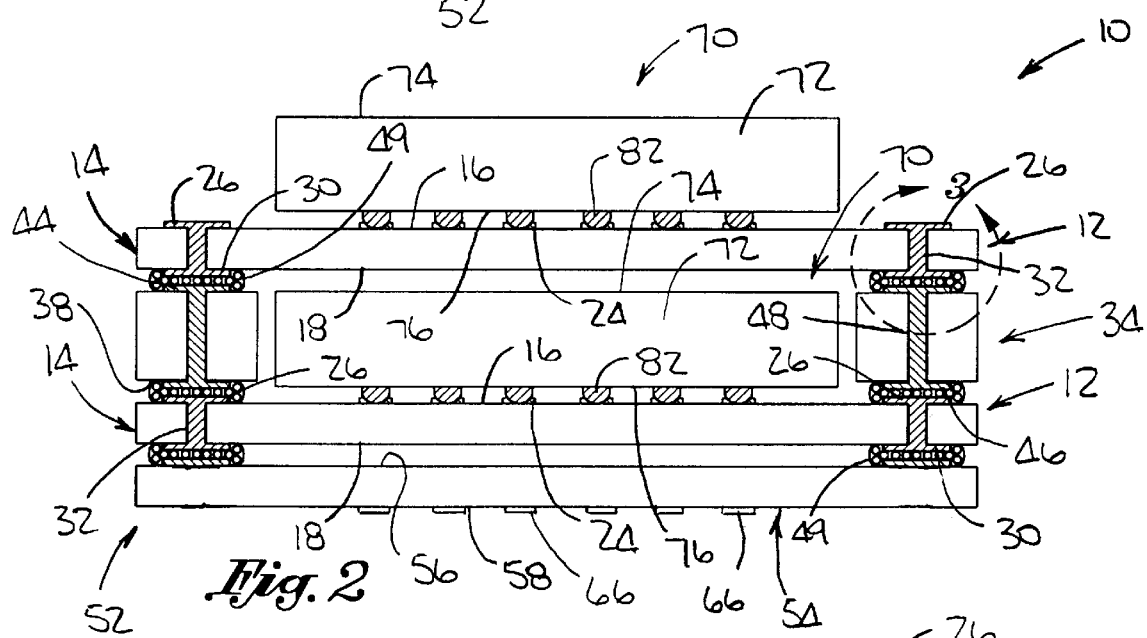
FIG. 2 is a cross-sectional view of the chip stack taken along line 2—2 of FIG. 1.
Figure 3:
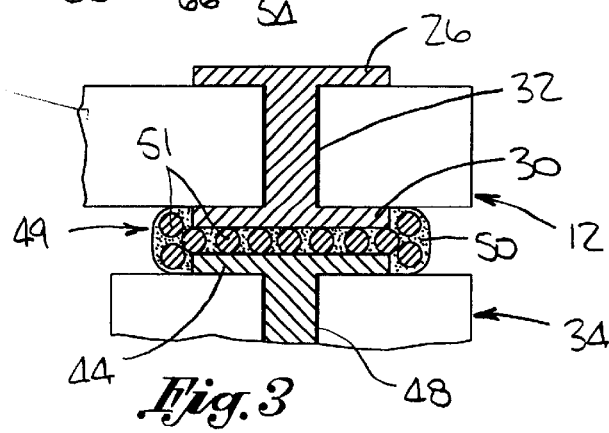
FIG. 3 is an enlargement of the encircled region 3 shown in FIG. 2.
Figure 4:
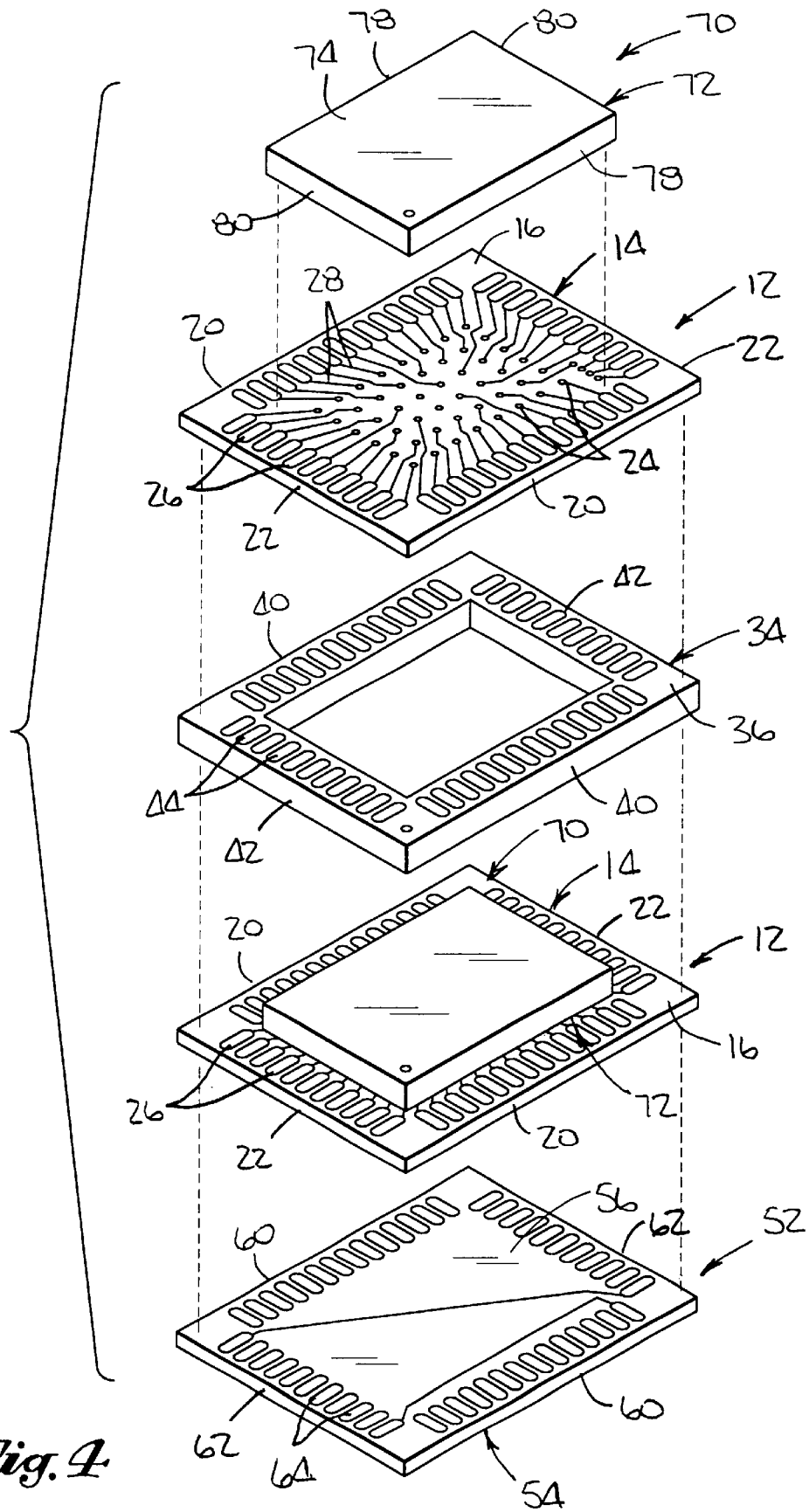
FIG. 4 is an exploded view of the chip stack shown in FIG. 1.

As is best seen in FIGS. 2 and 3, each of the base pads 26 of the second set is electrically connected to a respective one of the base pads 30 of the third set via a base feed-through hole 32. Each base feed-through hole 32 may be plugged with a conductive material or may be left open. If the holes 32 are plugged, the conductive material is preferably selected from the group consisting of nickel, gold, tin, silver epoxy, and combinations thereof. The base pads 26, 30 of the second and third sets, as well as the base pads 24 of the first set, may each be rectangular, oval, or circular in shape. In this respect, each base feed-through hole 32 preferably extends axially between each corresponding, coaxially aligned pair of the base pads 26, 30 of the second and third sets.

In addition to the base layers 12, the chip stack 10 of the present invention comprises at least one rectangularly configured interconnect frame 34. The interconnect frame 34 defines a generally planar top surface 36, a generally planar bottom surface 38, an opposed pair of longitudinal side sections 40, and an opposed pair of lateral side sections 42. Disposed on the interconnect frame 34 is a second conductive pattern which itself preferably comprises a first set of frame pads 44 disposed on the top surface 36, and a second set of frame pads 46 disposed on the bottom surface 38. The frame pads 44, 46 of the first and second sets are preferably arranged in patterns which are identical to each other, and to the patterns of the second and third sets of base pads 26, 30 of each of the base layers 12. In this respect, the frame pads 44, 46 of the first and second sets each extend linearly along the longitudinal and lateral side sections 40, 42 of the interconnect frame 34, with each of the frame pads 44 of the first set being aligned with and electrically connected to a respective one of the frame pads 46 of the second set. As best seen in FIG. 3, similar to the electrical connection of the base pads 26, 30 of the second and third sets to each other, the electrical connection of each of the frame pads 44 of the first set to a respective one of the frame pads 46 of the second set is preferably accomplished via a frame feed-through hole 48 which also may be plugged with a conductive material or may be left open. If the holes 48 are plugged, the conductive material is preferably selected from the same group used as the conductive material to plug the base feed-through holes 32, i.e., nickel, gold, tin, silver epoxy, and combinations thereof. Each of the frame feed-through holes 48 preferably extends axially between a corresponding, coaxially aligned pair of the frame pads 44, 46 of the first and second sets, with the plugging of the frame feed-through holes 48 preferably occurring prior to the surface plating of the frame pads 44, 46 of the first and second sets to respective ones of the top and bottom surfaces 36, 38 of the interconnect frame 34.

In the chip stack 10, the interconnect frame 34 is disposed between the base layers 12, with the second conductive pattern of the interconnect frame 34 being electrically connected to the first conductive pattern of each of the base layers 12. More particularly, the frame pads 46 of the second set are electrically connected to respective ones of the base pads 26 of the second set of one of the base layers 12 (i.e., the base layer 12 immediately below the interconnect frame 34 in the chip stack 10), with the frame pads 44 of the first set being electrically connected to respective ones of the base pads 30 of the third set of one of the base layers 12 (i.e., the base layer 12 immediately above the interconnect frame 34 in the chip stack 10). Due to the base pads 26, 30 of the second and third sets and the frame pads 44, 46 of the first and second sets all being arranged in identical patterns, each coaxially aligned pair of frame pads 44, 46 of the first and second sets is itself coaxially aligned with a coaxially aligned set of base pads 26, 30 of the second and third sets of each of the adjacent base layers 12.

As best seen in FIGS. 2 and 3, the electrical connection of the second conductive pattern of the interconnect frame 34 to the first conductive pattern of each of the adjacent base layers 12 is preferably facilitated via an anisotropic epoxy 49. The anisotropic epoxy 49 comprises a fast cure epoxy component 50 which contains small conductive particles 51 uniformly dispersed therewithin. As indicated above, the density of the particles 51 is limited to the amount that does not cause contact therebetween. The epoxy component 50 may be in the form of a liquid or film. Typically, gold plated nickel particles 51 of uniform size anywhere from 5 to 10 microns in diameter are used in the anisotropic epoxy 49. The composition of these particles 51 does not include any toxic materials (e.g., lead). As will be discussed in more detail below, the anisotropic epoxy 49 is dispensed (if a liquid) or placed (if a film) between respective opposing, coaxially aligned sets of the base and frame pads 26, 30, 44, 46, with heat and pressure thereafter being applied. With pressure, the particles 51 are trapped between a respective opposing set of the base and frame pads 26, 30, 44, 46, thus forming a conductive conduit therebetween. The heat cures the epoxy component 50, thereby maintaining the base layers 12 in attachment to the interconnect frame 34. As will also be discussed below, the interconnect frame 34 is prepared for use in the chip stack 10 by forming generally semi-spherically shaped bumps of the anisotropic epoxy 49 on each of the frame pads 44, 46 of the first and second sets.

The chip stack 10 of the present invention further preferably comprises a transposer layer 52. The transposer layer 52 itself comprises a rectangularly configured transposer substrate 54 which defines a generally planar top surface 56, a generally planar bottom surface 58, an opposed pair of longitudinal peripheral edge segments 60, and an opposed pair of lateral peripheral edge segments 62. Disposed on the transposer substrate 54 is a third conductive pattern. The third conductive pattern comprises a first set of transposer pads 64 which are disposed on the top surface 56 of the transposer substrate 54, and a second set of transposer pads 66 which are disposed on the bottom surface 58 thereof. The transposer pads 64 of the first set are electrically connected to respective ones of the transposer pads 66 of the second set via conductive traces. The transposer pads 64 of the first set are preferably arranged in a pattern which is identical to the patterns of the second and third sets of base pads 26, 30 and the first and second sets of frame pads 44, 46. In this respect, the transposer pads 64 of the first set extend linearly along the longitudinal and lateral peripheral edge segments 60, 62 of the transposer substrate 54. The transposer pads 66 of the second set are themselves preferably arranged in a generally rectangular pattern or array in the central portion of the bottom surface 58 of the transposer substrate 54, with the pattern of the transposer pads 66 of the second set preferably being identical to the pattern of the base pads 24 of the first set of each of the base layers 12.

In the preferred embodiment, the transposer layer 52 is prepared for use in the chip stack 10 by forming generally spherically shaped solder balls 68 on each of the transposer pads 66 of the second set. These solder balls 68 are preferably formed by stencil printing solder paste onto each of the transposer pads 66 of the second set, and thereafter reflowing the solder paste to form the solder balls 68. The aperture in the stencil used to form the solder balls 68 is typically larger than each of the transposer pads 66 and thick enough to deposit sufficient solder to form the solder balls 68. As seen in FIG. 5, the transposer layer 52 is also prepared for use in the chip stack 10 by forming generally semi-spherically shaped bumps of the anisotropic epoxy 49 on each of the transposer pads 64 of the first set. These bumps of the anisotropic epoxy 49 are preferably formed in the same manner previously described in relation to the formation of the bumps of the anisotropic epoxy 49 on the frame pads 44, 46 of the first and second sets.

In the chip stack 10, the first conductive pattern of one of the base layers 12 (i.e., the lowermost base layer 12 in the chip stack 10) is electrically connected to the third conductive pattern of the transposer layer 52. More particularly, each of the base pads 30 of the third set of the lowermost base layer 12 is electrically connected to a respective one of the transposer pads 64 of the first set. Due to the base pads 30 of the third set and the transposer pads 64 of the first set being arranged in identical patterns, each of the base pads 30 of third set is coaxially alignable with a respective one of the transposer pads 64 of the first set, with the electrical connection therebetween preferably being facilitated via the anisotropic epoxy 49 in the same manner previously described in relation to the use of the anisotropic epoxy 49 to secure and electrically connect the interconnect frame 34 to the base substrates 14 of the base layers 12.

In the present chip stack 10, the base pads 24, 26, 30 of the first, second and third sets, the conductive traces 28, the frame pads 44, 46 of the first and second sets, and the transposer pads 64, 66 of the first and second sets are each preferably fabricated from very thin copper having a thickness in the range of from about five microns to about twenty-five microns through the use of conventional etching techniques. Advantageously, the use of thin copper for the various pads and traces 28 allows for etching line widths and spacings down to a pitch of about 4 mils which substantially increases the routing density on each of the base layers 12, as well as the transposer layer 52. Due to the preferred use of the anisotropic epoxy 49 to facilitate the electrical interconnection between the interconnect frame 34 and the base layers 12, and between the lowermost base layer 12 and the transposer layer 52, the base pads 26, 30, the frame pads 44, 46, and the transposer pads 64 may be nickel/gold plated or plated with a tin based metal. If such pads are nickel/gold plated, the particles 51 of the anisotropic epoxy 49 will form a pressure contact therebetween. If, alternatively, such pads are plated with a tin based metal and sufficient heat is applied, the particles 51 will form a metallurgical connection therebetween.

Additionally, the base substrate 14, the interconnect frame 34, and the transposer substrate 54 are each preferably fabricated from either FR-4, polyamide, or some other suitable material which can easily be routed. As indicated above, all of the base feed-through holes 32 and frame feed-through holes 48 may be plugged with a conductive material prior to the surface plating procedure used to form the base pads 24, 26, 30 of the first, second and third sets, and the frame pads 44, 46 of the first and second sets. The material used to form each base substrate 14 and/or the transposer substrate 54 may be as thin as about 0.010 inches or may be a thicker multilayer structure.

The chip stack 10 of the present invention further comprises at least two identically configured integrated circuit chips 70 which are electrically connected to respective ones of the first conductive patterns of the base layers 12. Each of the integrated circuit chips 70 preferably comprises a rectangularly configured body 72 defining a generally planar top surface 74, a generally planar bottom surface 76, an opposed pair of longitudinal sides 78, and an opposed pair of lateral sides 80. Disposed on the bottom surface 76 of the body 72 are a plurality of generally seme-spherically shaped conductive contacts 82 which are preferably arranged in a pattern identical to the patterns of the base pads 24 of the first set and the transposer pads 66 of the second set. The conductive contacts 82 of each of the integrated circuit chips 70 are electrically connected to respective ones of the base pads 24 of the first set of a respective one of the first conductive patterns of the base layers 12. Due to the conductive contacts 82 and base pads 24 of each of the first sets being arranged in identical patterns, the conductive contacts 82 of each of the integrated circuit chips 70 are coaxially alignable with respective ones of the base pads 24 of the corresponding first set.

The electrical connection of the conductive contacts 82 of each integrated circuit chip 70 to respective ones of the base pads 24 of the first set of a respective one of the first conductive patterns may be accomplished through the use of the anisotropic epoxy 49 or alternatively through the use of solder. If the anisotropic epoxy 49 is utilized, the same is preferably spread over the conductive contacts 82 and/or the base pads 24 of the corresponding first set. Similarly, solder is preferably pre-applied to each of the conductive contacts 82 if used as the interconnect medium. In the chip stack 10, each of the integrated circuit chips 70 is preferably a CSP (Chip Scale Package) such as a BGA (ball grid array) device. The integrated circuit chips 70 may each alternatively comprise a fine pitch BGA device or a flip chip device. Still further, the integrated circuit chips 70 may each comprise an LP (leaded plastic) package such as a TSOP (thin small outline package) device or a TQFP device. Still further, the integrated circuit chip 70 may each comprise a bare die device. Those of ordinary skill in the art will recognize that the chip stack 10 of the present invention may be assembled to include an intermix of integrated circuit chips 70 of differing types.

In the present chip stack 10, a layer 84 of flux/underfill may be disposed between the bottom surface 76 of the body 72 of each of the integrated circuit chips 70 and respective ones of the top surfaces 16 of the base substrates 14. Each layer 84 of the flux/underfill is preferably spread over the base pads 24 of the first set of a respective one of the first conductive patterns of the base layers 12. Each layer 84 substantially encapsulates the conductive contacts 82 of the corresponding integrated circuit chip 70 when the same is electrically connected to the first conductive pattern of a respective one of the base layers 12. The layer 84 of flux/underfill will only be used in relation to each integrated circuit chip 70 in the chip stack 10 when solder is employed as the interconnect medium between the integrated circuit chip 70 and respective ones of the first conductive patterns of the base layers 12.

Prior to the attachment of the integrated circuit chip 70 to a respective base layer 12, a bakeout cycle is required to drive out the moisture in the base layer 12 and the corresponding integrated circuit chip 70. A cycle of approximately eight hours at about 125° Celsius is desirable, which is followed by storage in a dry nitrogen atmosphere until use. If solder is used as the interconnect medium, the first step in the attachment of the integrated circuit chip 70 to the corresponding base layer 12 is the precise deposition of the layer 84 of an appropriate flux/underfill material over the base pads 24 of the corresponding first set. The integrated circuit chip 70 is then placed over the pad area, squeezing out the flux/underfill material of the layer 84 to the longitudinal and lateral sides 78, 80 of the body 72 and seating the conductive contacts 82 onto respective ones of the base pads 24 of the corresponding first set. If done properly, the layer 84 of the flux/underfill material, when cured, will have no voids or minimum voids. The base layer 12 having the integrated circuit chip 70 positioned thereupon in the above-described manner is then run through a solder reflow cycle with no dwelling time at an intermediate temperature of approximately 150° Celsius. A post cure cycle to complete the polymerization of the layer 84 of the flux/underfill material may be required depending on the particular flux/underfill material used in the layer 84. At this juncture, the base layer 12 having the integrated circuit chip 70 electrically connected thereto may be electrically tested.

In the prior art, the standard approach for the attachment or electrical connection of the conductive contacts of a BGA device to an attachment or pad site is to first flux the pad site or conductive contacts of the BGA device, place the BGA device on the pad site in the proper orientation, reflow the solder pre-applied to the conductive contacts of the BGA device to facilitate the electrical connection to the pad site, clean, then underfill and cure. The cleaning step typically requires considerable time since the gap under the bottom surface of the body of the BGA device is very small and very difficult to penetrate with standard cleaning methods. Also, the removal of the cleaning fluid (which is generally water) requires long bakeout times.

The underfill of an epoxy between the bottom surface of the body of the BGA device and the top surface of the substrate having the pad site thereon is a relatively easy procedure, but is very slow. If a no-clean flux is used for attachment, the residue from the flux typically becomes entrapped within the epoxy underfill and may cause corrosion problems. A subsequent solder reflow process to facilitate the attachment of the chip stack to a main printed circuit board (PCB) often causes the residue flux to vaporize which exerts pressure on the solder joints and could delaminate the structure. Most underfill materials become very hard (i.e., greater than ninety shore D) and are cured at a temperature of less than about 180° Celsius. The solder is solid at this temperature and the underfill encases the solder with no room for expansion. The solder from the conductive contacts of the BGA device expands when molten again, thus exerting pressure which can delaminate the structure. If the chip stack is not subjected to subsequent reflow temperatures when completed, there is no problem. However, the chip stack must be able to withstand the subsequent reflow temperature.

The flux/underfill material used for the layer 84 provides both flux and underfill properties with one formulation. As the temperature rises during the solder reflow process, the flux characteristics of the material aid in the solder process, with extended exposure to the peak solder reflow temperature beginning the polymerization process of the underfill portion of the material. The flux is incorporated into the underfill, thus becoming one compatible material which is cured above the melting point of solder. Thus, there is room within the encased solder for expansion at the reflow temperature. No cleaning steps are required, though careful dispensing of the correct volume and accurate placement of the integrated circuit chip 70 upon its corresponding base layer 12 is critical.

On the other hand, if the anisotropic epoxy 49 is used as the interconnect medium as an alternative to solder for the electrical connection of the integrated circuit chips 70 to respective ones of the base layers 12, the layer 84 of flux/underfill will not be included. Rather, the anisotropic epoxy 49 will preferably be spread over the base pads 24 of the first set of each of the first conductive patterns of each of the base layers 12. Each integrated circuit chip 70 is then placed over a corresponding pad area, with the conductive contacts 82 thereof being seated into the anisotropic epoxy 49 applied to the base pads 24 of the corresponding first set.

The complete chip stack 10 shown in FIG. 1 includes a transposer layer 52, two base layers 12, one interconnect frame 34, and two integrated circuit chips 70. The first conductive pattern of the lowermost base layer 12 is electrically connected to the third conductive pattern of the transposer layer 52 via the anisotropic epoxy 49 in the above-described manner. Additionally, the interconnect frame 34 is disposed or positioned between the adjacent pair of base layers 12, with the second conductive pattern of the interconnect frame 34 being electrically connected to the first conductive patterns of such adjacent pair of base layers 12 via the anisotropic epoxy 49 in the above-described manner. Since the conductive contacts 82 of each of the integrated circuit chips 70 are electrically connected to respective ones of the base pads 24 of the first set of respective ones of the first conductive patterns, the lower integrated circuit chip 70 is disposed between the adjacent pair of base layers 12 and circumvented by the interconnect frame 34. Thus, the bodies 72 of the integrated circuit chips 70 and the interconnect frame 34 are preferably sized relative to each other such that the top surface 74 of the body 72 of the integrated circuit chip 70 which is circumvented by the interconnect frame 34 does not protrude beyond the top surface 36 thereof.

As also indicated above, all the various electrical connections within the chip stack 10, with the possible exception of the electrical connection of the integrated circuit chips 70 to the base layers 12, are facilitated via the anisotropic epoxy 49. The solder balls 68 form a ball grid array on the bottom of the chip stack 10 which is specifically suited for facilitating the attachment of the chip stack 10 to a printed circuit board (PCB). Those of ordinary skill in the art will recognize that the chip stack 10 may be assembled to include greater than two base layers 12, one interconnect frame 34, and two integrated circuit chips 70.

Having thus described the structural attributes of the chip stack 10, the preferred method of assembling the same will now be described with specific reference to FIGS. 5–8. In accordance with the present invention, multiple chip stacks 10 may be concurrently assembled through the use of a transposer panel 86, at least two base panels 88, at least one frame panel 90, and a plurality of integrated circuit chips 70. The transposer panel 86 is formed to include multiple groups of the first and second sets of transposer pads 64, 66 with such groups being formed on the transposer panel 86 in spaced relation to each other. Similarly, each of the base panels 88 is formed to include multiple groups of the first, second and third sets of base pads 24, 26, 30, with the frame panels 90 each being formed to include multiple groups of the first and second sets of frame pads 44, 46. As indicated above, the transposer panel 86 is prepared such that the transposer pads 64 of the first set of each group have the bumps on the anisotropic epoxy 49 formed thereon, with the transposer pads 66 of the second set of each group having the solder balls 68 formed thereon. Similarly, each of the frame panels 90 is prepared such that the first and second sets of frame pads 44, 46 of each group have the bumps of the anisotropic epoxy 49 formed thereon.

In a preferred assembly process, the integrated circuit chips 70 are electrically connected to respective ones of each of the first sets of base pads 24 included on each of the base panels 88. Such electrical connection is accomplished through the use of solder or the anisotropic epoxy 49 in the above-described manner. Subsequent to the pre-attachment of the integrated circuit chips 70 to the base panels 88, bumps of the anisotropic epoxy 49 are applied to each of the transposer pads 64 of the first set of the transposer panel 86, and to each of the frame pads 44, 46 of the first and second sets of the frame panel 90. The transposer panel 86 is then cooperatively engaged to a stacking fixture such that the solder balls 68 face or are directed downwardly. A base panel 88 is then stacked upon the transposer panel 86 such that the base pads 30 of the third set of each group face or are directed downwardly and are aligned with respective ones of the transposer pads 64 of the first set of the corresponding group upon the transposer panel 86 immediately therebelow.

In the next step of the assembly process, a frame panel 90 is stacked upon the base panel 88 such that the bodies 72 of the integrated circuit chips 70 are each circumvented by the frame panel 90. Another base panel 88 is then stacked upon the frame panel 90 in a manner wherein the base pads 30 of the third set of each group of such uppermost base panel 88 are aligned with respective ones of the frame pads 44 of the first set of the corresponding group upon the frame panel 90 immediately therebelow. As will be recognized, the above-described stacking process may be continued or repeated to form a chip stack having a greater number of electrically interconnected integrated circuit chips 70.

Upon the stacking of the various panels in the above-described manner, a pressure plate is applied to the top of the stack to maintain such panels in prescribed orientations relative to each other. The stacked panels are then placed into a heated lamination press. With the pressure applied by the lamination press, the particles 51 of the anisotropic epoxy 49 are trapped between respective opposing pairs of the base, frame, and transposer pads 26, 30, 44, 46, 64 in the manner shown in FIGS. 7 and 8, thus forming a conductive conduit between such pads. The heat applied by the lamination press cures the epoxy component 50 of the anisotropic epoxy 49, which thus holds the various panels and hence the structure together. Once cured, the anisotropic epoxy 49 does not reflow at temperatures above 200° C. The processing window is very tolerant with process temperatures below 200° C. Upon the completion of curing process for the anisotropic epoxy 49, the individual chip stacks are separated through the use of a router.

As indicated above, if the base, frame, and transposer pads 26, 30, 44, 46, 64 are nickel/gold plated, the particles 51 form a pressure contact between the pads. If such pads are plated with a tin based metal and sufficient heat is applied by the lamination press, the particles 51 form a metallurgical connection between the pads. By controlling the size of the particles 51, bridging between adjacent pads is eliminated. Fine pitch between the pads can therefore be achieved. Additionally, since flux is not used, post assembly cleaning is not required. Those of ordinary skill in the art will recognize that a transposer panel 86 need not necessarily be included in the assembly process, since the lowermost base layer 12 in any chip stack may be used as a transposer board to facilitate the mounting or electrical connection of the chip stack to a PCB.

Additional modifications and improvements of the present invention may also be apparent to those of ordinary skill in the art. Thus, the particular combination of parts and steps described and illustrated herein is intended to represent only one embodiment of the present invention, and is not intended to serve as limitations of alternative devices and methods within the spirit and scope of the invention.

What is claimed is:

1. A chip stack comprising:
   at least two base layers, each of the base layers comprising:
   a base substrate; and
   a first conductive pattern disposed on the base substrate;
   at least one interconnect frame having a second conductive pattern disposed thereon, the interconnect frame being disposed between the base layers, with the second conductive pattern being electrically connected to the first conductive pattern of each of the base layers via an anisotropic epoxy; and
   at least two integrated circuit chips electrically connected to respective ones of the first conductive patterns, one of the integrated circuit chips being at least partially circumvented by the interconnect frame and at least partially covered by one of the base layers.

2. A chip stack of claim 1 further comprising:
a transposer layer comprising:
  a transposer substrate; and
  a third conductive pattern disposed on the transposer substrate;
the first conductive pattern of one of the base layers being electrically connected to the third conductive pattern via the anisotropic epoxy.

3. The chip stack of claim 2 wherein:
the base substrate defines opposed top and bottom surfaces; and
the first conductive pattern comprises:
  a first set of base pads disposed on the top surface of the base substrate;
  a second set of base pads disposed on the top surface of the base substrate and electrically connected to respective ones of the base pads of the first set; and
  a third set of base pads disposed on the bottom surface of the base substrate and electrically connected to respective ones of the base pads of the second set;
the integrated circuit chips being disposed upon respective ones of the top surfaces of the base substrates and electrically connected to at least some of the base pads of respective ones of the first sets, with the base pads of the second set of one of the base layers being electrically connected to the second conductive pattern via the anisotropic epoxy, and the base pads of the third set of one of the base layers being electrically connected to the second conductive pattern via the anisotropic epoxy.

4. The chip stack of claim 3 wherein:
the interconnect frame defines opposed top and bottom surfaces; and
the second conductive pattern comprises:
  a first set of frame pads disposed on the top surface of the interconnect frame; and
  a second set of frame pads disposed on the bottom surface of the interconnect frame and electrically connected to respective ones of the frame pads of the first set;
the interconnect frame being disposed between the base layers such that the frame pads of the second set are electrically connected to respective ones of the base pads of the second set of one of the base layers via the anisotropic epoxy, and the frame pads of the first set are electrically connected to respective ones of the base pads of the third set of one of the base layers via the anisotropic epoxy.

5. The chip stack of claim 4 wherein:
the transposer substrate defines opposed top and bottom surfaces; and
the third conductive pattern comprises:
  a first set of transposer pads disposed on the top surface of the transposer substrate; and
  a second set of transposer pads disposed on the bottom surface of the transposer substrate and electrically connected to respective ones of the transposer pads of the first set;
the base pads of the third set of one of the base layers being electrically connected to respective ones of the transposer pads of the first set via the anisotropic epoxy.

6. The chip stack of claim 5 wherein the transposer pads of the first set, the frame pads of the first and second sets, and the base pads of the second and third sets are arranged in identical patterns.

7. The chip stack of claim 6 wherein:
the transposer and base substrates each have a generally rectangular configuration defining opposed pairs of longitudinal and lateral peripheral edge segments;
the interconnect frame has a generally rectangular configuration defining opposed pairs of longitudinal and lateral side sections;
the transposer pads of the first set extend along the longitudinal and lateral peripheral edge segments of the transposer substrate;
the first and second sets of frame pads extend along the longitudinal and lateral side sections of the interconnect frame; and
the second and third sets of base pads extend along the longitudinal and lateral peripheral edge segments of the base substrate.

8. The chip stack of claim 6 wherein each of the transposer pads of the second set has a generally spherical configuration.

9. The chip stack of claim 6 wherein:
each of the frame pads of the first set is electrically connected to a respective one of the frame pads of the second set via a frame feed-through hole; and
each of the base pads of the second set is electrically connected to a respective one of the base pads of the third set via a base feed-through hole.

10. The chip stack of claim 9 wherein each of the frame and base feed-through holes is plugged with a conductive material.

11. The chip stack of claim 6 wherein the integrated circuit chips each comprise:
a body having opposed, generally planar top and bottom surfaces; and
a plurality of conductive contacts disposed on the bottom surface of the body;
the conductive contacts of each of the integrated circuit chips being electrically connected to respective ones of the base pads of the first set of a respective one of the first conductive patterns.

12. The chip stack of claim 11 wherein the transposer pads of the second set, the base pads of the first set, and the conductive contacts are arranged in identical patterns.

13. The chip stack of claim 11 further comprising a layer of flux/underfill disposed between the bottom surface of the body of each of the integrated circuit chips and respective ones of the top surfaces of the base substrates.

14. The chip stack of claim 11 wherein the body of each of the integrated circuit chips and the interconnect frame are sized relative to each other such that the top surface of the body of the integrated circuit chip at least partially circumvented by the interconnect frame does not protrude beyond the top surface thereof.

15. The chip stack of claim 11 wherein the integrated circuit chips are each selected from the group consisting of:
  a BGA device;
  a fine pitch BGA device;
  a CSP device; and
  a flip chip device.

16. The chip stack of claim 1 further comprising:

a second interconnect frame, the second conductive pattern of which is electrically connected to the first conductive pattern of one of the base layers via the anisotropic epoxy such that the second interconnect frame at least partially circumvents one the integrated circuit chips;

a third base layer, the first conductive pattern of which is electrically connected to the second conductive pattern of the second interconnect frame via the anisotropic epoxy such that the third base layer at least partially covers one of the integrated circuit chips; and a third integrated circuit chip electrically connected to the first conductive pattern of the third base layer.

17. The chip stack of claim 16 further comprising:

a multiplicity of additional interconnect frames, base layers, and integrated circuit chips;

the second conductive pattern of each of the interconnect frames being electrically connected to the first conductive patterns of any adjacent pair of base layers via the anisotropic epoxy, with each of the integrated circuit chips being electrically connected to the first conductive pattern of a respective one of the base layers.

* * * * *